(12) United States Patent
Jin

(10) Patent No.: US 8,559,186 B2
(45) Date of Patent: Oct. 15, 2013

(54) INDUCTOR WITH PATTERNED GROUND PLANE

(75) Inventor: Zhang Jin, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 488 days.

(21) Appl. No.: 12/062,442

(22) Filed: Apr. 3, 2008

(65) Prior Publication Data

US 2009/0250262 A1 Oct. 8, 2009

(51) Int. Cl.
*H05K 1/11* (2006.01)
(52) U.S. Cl.
USPC ........... 361/794; 361/818; 174/524; 257/527; 257/531; 333/116; 333/128; 336/182
(58) Field of Classification Search
USPC ........... 361/794, 818; 174/524; 257/531, 527; 333/116, 128; 336/182
See application file for complete search history.

(56) References Cited

U.S. PATENT DOCUMENTS

| | | | | |
|---|---|---|---|---|
| 3,599,121 | A * | 8/1971 | Buck et al. | 333/161 |
| 3,643,182 | A * | 2/1972 | Swanson | 333/140 |
| 3,904,994 | A * | 9/1975 | Bates et al. | 333/161 |
| 4,371,982 | A * | 2/1983 | Hallford | 455/327 |
| 4,800,393 | A * | 1/1989 | Edward et al. | 343/821 |
| 5,793,263 | A * | 8/1998 | Pozar | 333/26 |
| 6,525,623 | B2 * | 2/2003 | Sridharan et al. | 333/128 |
| 6,586,309 | B1 * | 7/2003 | Yeo et al. | 438/381 |
| 6,794,978 | B2 * | 9/2004 | Zhang et al. | 336/200 |
| 6,822,434 | B2 * | 11/2004 | Haslett et al. | 324/127 |
| 6,833,603 | B1 * | 12/2004 | Park et al. | 257/528 |
| 6,905,889 | B2 | 6/2005 | Lowther | |
| 6,921,959 | B2 | 7/2005 | Watanabe | |
| 7,005,920 | B2 * | 2/2006 | Mukherjee et al. | 330/253 |
| 7,084,728 | B2 | 8/2006 | Hyvonen | |
| 7,154,161 | B1 * | 12/2006 | Blaschke et al. | 257/531 |
| 7,167,044 | B2 * | 1/2007 | Li et al. | 330/129 |

(Continued)

FOREIGN PATENT DOCUMENTS

| JP | 2004311655 A | 11/2004 |
|---|---|---|
| JP | 2005236033 | 9/2005 |

(Continued)

OTHER PUBLICATIONS

Yue, Patrick C., Wong, Simon S., "On-Chip Spiral Inductors with Patterned Ground Shields for Si-Based RF IC's," IEEE Journal of Solid-State Circuits, vol. 33, No. 5, May 1998.

(Continued)

*Primary Examiner* — Xiaoliang Chen
(74) *Attorney, Agent, or Firm* — William M. Hooks

(57) ABSTRACT

An inductor with patterned ground plane is described. In one design, the inductor includes a conductor formed on a first layer and a patterned ground plane formed on a second layer under the conductor. The patterned ground plane has an open center area and a shape matching the shape of the conductor. The patterned ground plane includes multiple shields, e.g., eight shields for eight sides of an octagonal shape conductor. Each shield has multiple slots formed perpendicular to the conductor. Partitioning the patterned ground plane into separate shields and forming slots on each shield help prevent the flow of eddy current on the patterned ground plane, which may improve the Q of the inductor. Multiple interconnects couple the multiple shields to circuit ground, which may be located at the center of the conductor.

24 Claims, 7 Drawing Sheets

(56) References Cited

U.S. PATENT DOCUMENTS

| | | | |
|---|---|---|---|
| 7,259,641 B1 * | 8/2007 | Weller et al. | 333/161 |
| 7,362,283 B2 * | 4/2008 | Quintero Illera et al. | 343/846 |
| 7,379,287 B2 * | 5/2008 | Fujimoto | 361/267 |
| 7,382,219 B1 * | 6/2008 | Lee | 336/84 C |
| 7,411,553 B2 * | 8/2008 | Oota et al. | 343/700 MS |
| 7,470,927 B2 * | 12/2008 | Lee et al. | 174/524 |
| 7,619,325 B1 * | 11/2009 | Hennessy et al. | 307/147 |
| 2002/0158305 A1 * | 10/2002 | Dalmia et al. | 257/531 |
| 2004/0195692 A1 | 10/2004 | Adan | |
| 2005/0051869 A1 * | 3/2005 | Watanabe | 257/531 |
| 2005/0128038 A1 * | 6/2005 | Hyvonen | 336/182 |
| 2006/0028295 A1 * | 2/2006 | Piernas | 333/116 |
| 2006/0277749 A1 * | 12/2006 | Zhang et al. | 29/606 |
| 2007/0159286 A1 * | 7/2007 | Huang et al. | 336/200 |
| 2007/0216408 A1 * | 9/2007 | Ando et al. | 324/258 |
| 2008/0074332 A1 * | 3/2008 | Arronte et al. | 343/702 |
| 2008/0136727 A1 * | 6/2008 | Bit-Babik et al. | 343/848 |
| 2008/0158848 A1 * | 7/2008 | Free et al. | 361/818 |
| 2008/0174507 A1 * | 7/2008 | Illera et al. | 343/846 |
| 2008/0231521 A1 * | 9/2008 | Anguera Pros et al. | 343/702 |

FOREIGN PATENT DOCUMENTS

| | | |
|---|---|---|
| JP | 2006511068 A | 3/2006 |
| JP | 2006310533 | 11/2006 |
| WO | 2004055839 A1 | 7/2004 |
| WO | WO2005104814 | 11/2005 |

OTHER PUBLICATIONS

International Search Report and the Written Opinion—PCT/US2009/039525, International Search Authority—European Patent Office—Oct. 15, 2009.

Taiwan Search Report—TW098111319—TIPO—Mar. 25, 2013.

* cited by examiner

US 8,559,186 B2

INDUCTOR WITH PATTERNED GROUND PLANE

BACKGROUND

I. Field

The present disclosure relates generally to electronics, and more specifically to an inductor for an integrated circuit (IC) or a printed circuit board (PCB).

II. Background

With modern advances in IC process technology, it is possible to fabricate radio frequency ICs (RFICs) for various applications such as wireless communication, networking, computing, etc. These RFICs may include analog circuit blocks that were previously implemented with bulky discrete circuit components. By implementing the analog circuit blocks on RFICs, certain benefits such as smaller size, lower cost, and improved reliability may be realized.

Many analog circuit blocks utilize inductors to perform the desired functions and/or achieve the desired performance. For example, filters, resonator tank circuits, and impedance matching networks may include inductors to obtain the desired circuit response. For some applications, such as a resonator tank circuit for a voltage controlled oscillator (VCO), an inductor with high quality factor (Q) is desirable in order to obtain good performance for the VCO. However, it may be difficult to obtain high Q due to various types of losses as described below. This may be especially true at high frequencies used by many wireless communication systems.

SUMMARY

An inductor with a patterned ground plane and having higher Q and good performance at high frequency is described herein. A patterned ground plane is a ground plane having a pattern of etched out portions, which is in contrast to a solid ground plane without any etched out portion.

In one design, the inductor includes a conductor formed on a first layer and a patterned ground plane formed on a second layer under the conductor. The patterned ground plane may have an open center area and a shape matching the shape of the conductor. The patterned ground plane may include a plurality of shields. In one design, the conductor has an octagonal shape with eight sides, and the patterned ground plane has eight shields for the eight sides of the conductor. Each shield has a plurality of slots that are perpendicular to the conductor. Partitioning the patterned ground plane into separate shields and forming slots on each shield help prevent the flow of eddy current on the patterned ground plane, which may improve the Q of the inductor. A plurality of interconnects couple the plurality of shields to circuit ground, which may be located at the center of the patterned ground plane.

The inductor with patterned ground plane may be used for various circuit blocks such as a VCO, a low noise amplifier (LNA), etc. Various aspects and features of the disclosure are described in further detail below.

DETAILED DESCRIPTION

Figure 1:
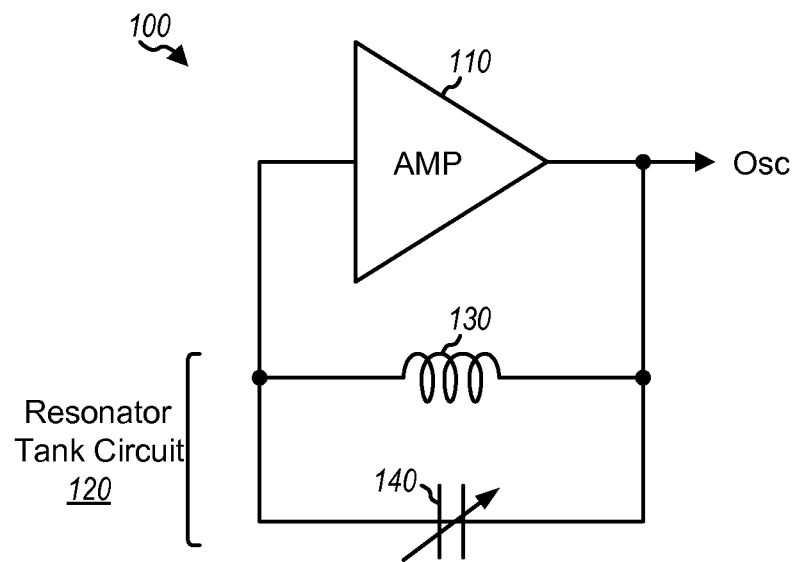
FIG. 1 shows a schematic diagram of a VCO.

FIG. 1 shows a schematic diagram of a design of a VCO 100. In this design, VCO 100 includes an amplifier (AMP) 110 and a resonator tank circuit 120, which is composed of an inductor 130 and a variable capacitor (varactor) 140. Amplifier 110 provides signal gain needed for oscillation. Amplifier 110 and resonator tank circuit 120 collectively provide 360° phase shift needed for oscillation. VCO 100 provides an oscillator signal (Osc) having a frequency of $f_{osc}$. The oscillation frequency $f_{osc}$ is determined mostly by the inductance of inductor 130 and the capacitance of varactor 140. All of the components of VCO 100, including inductor 130, may be fabricated on an RFIC to obtain various benefits such as smaller size, lower cost, and improved reliability.

Figure 2:
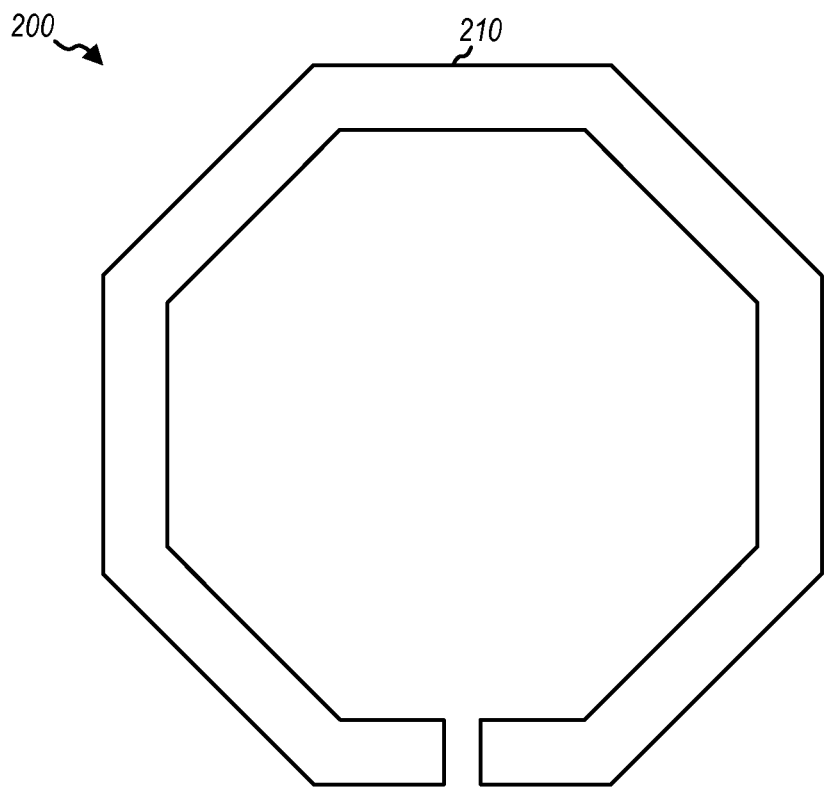
FIG. 2 shows a top view of an inductor without any shielding.

FIG. 2 shows a top view of an on-chip inductor 200 that may be implemented on an RFIC. Inductor 200 may be used for inductor 130 in FIG. 1. Inductor 200 includes a 1-turn conductor 210 having an octagonal shape. In general, an inductor may have any number of turns and any shape, e.g., square, rectangular, hexagonal, octagonal, circular, etc. An octagonal shape may provide good Q and ease of implementation.

The width of conductor 210, the number of turns, and the spacing between the turns may be selected based on various factors such as the desired inductance and Q for inductor 200. Conductor 210 may be fabricated with various types of conductive material such as (i) a low-loss metal (e.g., copper) on a metal layer, (ii) a lossy metal (e.g., aluminum) on a layer underneath the metal layer, or (iii) some other material. Higher Q may be achieved for inductor 200 if conductor 210 is fabricated with a low-loss metal. A smaller-size inductor 200 may be fabricated on a lossy metal layer because different IC design rules may apply.

On-chip inductor 200 may have lower Q due to silicon substrate loss, which may result from the resistivity of silicon. Silicon substrate loss may include magnetic loss and electric loss. Magnetic loss may result from eddy current induced on the silicon. Electric loss may result from resistance of the silicon. Silicon substrate loss may be worse at high frequencies and may be a major contributor that limits Q for a VCO operating in a range of 4 to 12 giga-Hertz (GHz).

On-chip inductor 200 may also have a relatively large size and may be more vulnerable to substrate noise. Noise on the substrate may couple to conductor 210 and degrade the quality of the signal in the conductor. A guard ring may be formed around conductor 210 to reduce substrate coupling. However, the guard ring may not be able to provide sufficient substrate isolation.

To mitigate silicon substrate loss and improve substrate isolation, a solid ground plane may be formed underneath conductor 210. This solid ground plane may improve electric loss by terminating the electric field from conductor 210 at the ground plane instead of the substrate. The solid ground plane may also improve substrate isolation and reduce substrate noise coupling. However, if the solid ground plane is formed with a low-loss metal, then the magnetic field from conductor 210 may be blocked, which may increase magnetic loss and adversely impact the performance of inductor 200. Conversely, if the solid ground plane is formed with a lossy material such as polysilicon, then the magnetic field may pass through the solid ground plane more easily, which may reduce magnetic loss. However, the lossy ground plane may not be as effective at blocking the electric field from terminating at the substrate.

Figure 3:
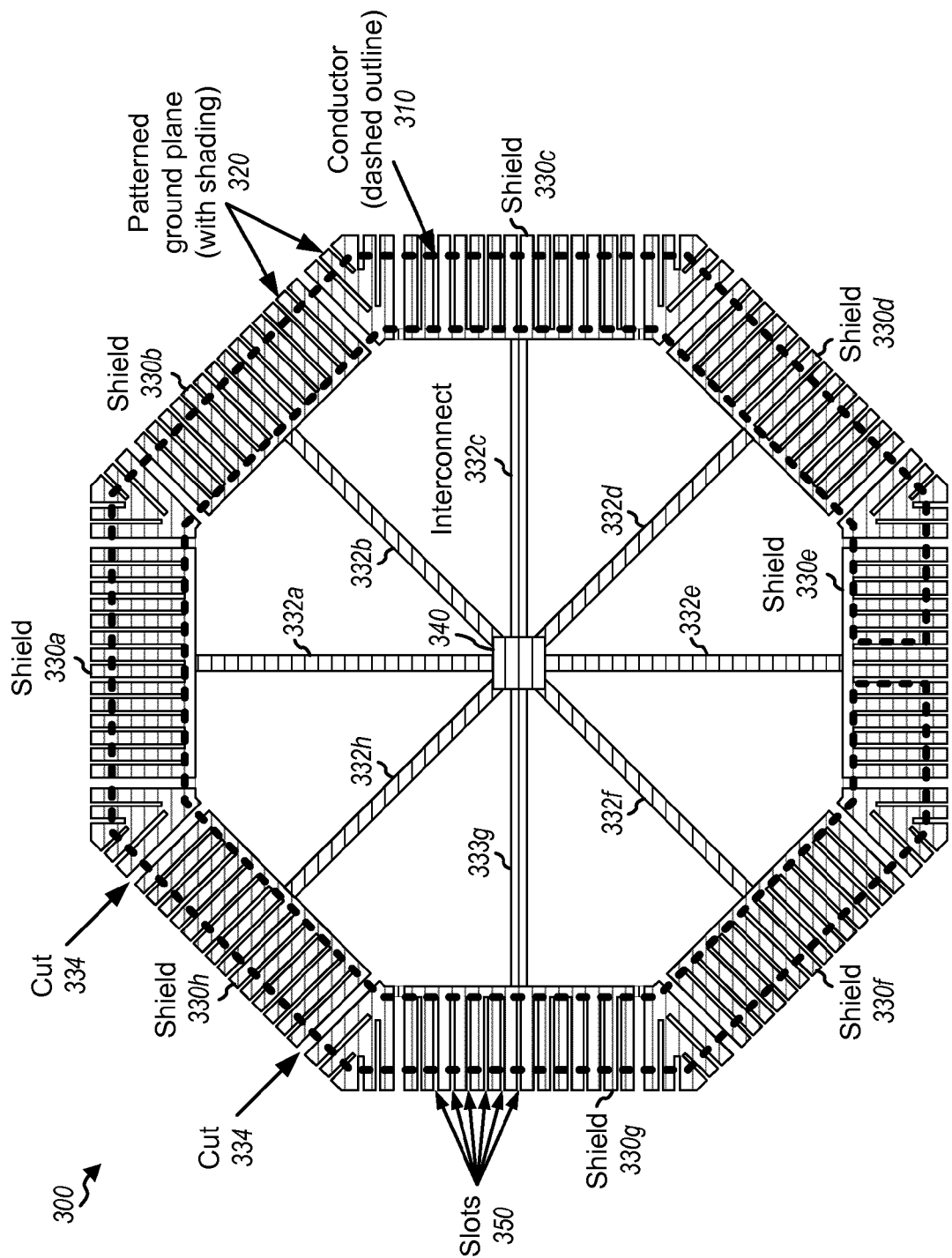
FIG. 3 shows a top view of an inductor with patterned ground plane.

FIG. 3 shows a top view of a design of an inductor 300 with a patterned ground plane 320. Inductor 300 may be used for inductor 130 in FIG. 1. In this design, inductor 300 includes a 1-turn conductor 310 having an octagonal shape and shown by a heavy dashed line in FIG. 3. The size of the octagonal shape and the width of conductor 310 may be selected to obtain the desired inductance and Q for inductor 300.

Patterned ground plane 320 may be designed to achieve the following functions:

Terminate the electric field from conductor 310, and
Allow the magnetic field to pass through patterned ground plane 320.

Patterned ground plane 320 includes various features to achieve the above functions.

In the design shown in FIG. 3, patterned ground plane 320 is formed substantially under conductor 310 and can thus shield the electric field from going to the substrate. This may then reduce electric loss and also provide isolation of substrate noise. Patterned ground plane 320 may have a shape that is slightly larger than conductor 310 in order to capture fringe electric field at the edges of the conductor. Patterned ground plane 320 does not cover the center area of conductor 310. This may allow the magnetic field to pass freely through the center area and hence may reduce magnetic loss. The magnetic field for inductor 300 may be similar to the magnetic field for inductor 200 in FIG. 2 without any ground plane, and good magnetic field distribution may be maintained even with patterned ground plane 320. Consequently, the inductance and series resistance of inductor 300 may change little even with the presence of patterned ground plane 320. Ground plane is not needed in the center area to terminate the electric field, which travels substantially from conductor 310 downward to the patterned ground plane underneath.

The magnetic field from current flowing on conductor 310 may cause eddy current on patterned ground plane 320. The eddy current on patterned ground plane 320 may reduce the inductance and lower the Q of inductor 300. Thus, it is desirable to prevent or reduce the flow of eddy current on patterned ground plane 320.

In the design shown in FIG. 3, patterned ground plane 320 is partitioned into eight separate shields 330a through 330h for the eight sides of conductor 310. The eight shields 330a through 330h are electrically isolated from each other by eight cuts 334 located near the eight corners of patterned ground plane 320. Partitioning patterned ground plane 320 into separate shields 330a through 330h helps prevent the flow of eddy current through the patterned ground plane.

The eight shields 330a through 330h are coupled via eight interconnects 332a through 332h, respectively, to a central ground point 340 located at the center of patterned ground plane 320. Interconnects 332a through 332h may be formed on the same layer and with the same material as shields 330a through 330h.

In one design, patterned ground plane 320 is formed with a low-loss metal in a metal layer under conductor 310. The low-loss metal may have higher conductivity and lower sheet resistance compared to polysilicon. The low-loss patterned ground plane may be more effective at terminating the electric field from conductor 310, which may then improve Q and substrate isolation for inductor 300. However, the low-loss metal may make it harder for the magnetic field to pass through.

In the design shown in FIG. 3, slots 350 are cut along patterned ground plane 320 and perform several functions. First, slots 350 allow the magnetic field to pass though, which may reduce magnetic loss. Second, slots 350 help cut the flow of eddy current within each shield 330, which may improve Q. If the slots are not present, then the magnetic field from the current on conductor 320 would induce eddy current on patterned ground plane 320 in the opposite direction as the current on conductor 320. Slots 350 are perpendicular to the normal flow of the eddy current within patterned ground plane 320 and can thus cut the eddy current flow. The size and spacing of slots 350 may be selected to (i) allow the magnetic field to pass through and (ii) terminate much of the electric field on patterned ground plane 320. In one design, slots 350 may be as narrow as 0.1 micrometer (µm), although other sizes may also be used.

In the design shown in FIG. 3, slots 350 are cut from the outer edges toward the inner edges of patterned ground plane 320 but stop short of the inner edges. Slots 350 are also perpendicular to (or at 90 degree angle with respect to) conductor 310 along all eight sides of the conductor. The perpendicular orientation of slots 350 helps cut the flow of eddy current. Interconnects 332a through 332h are coupled to the inner edges of shields 330a through 330h, respectively, of patterned ground plane 320. Computer simulation indicates that slots cut in this manner and connection of interconnects 332 to the inside edges of shields 330 can provide good performance.

In the design shown in FIG. 3, patterned ground plane 320 is symmetric between the left side and the right side and is also symmetric between the top half and the bottom half. This symmetry may allow for cancellation of eddy current within interconnects 332a through 332h.

Figure 4:
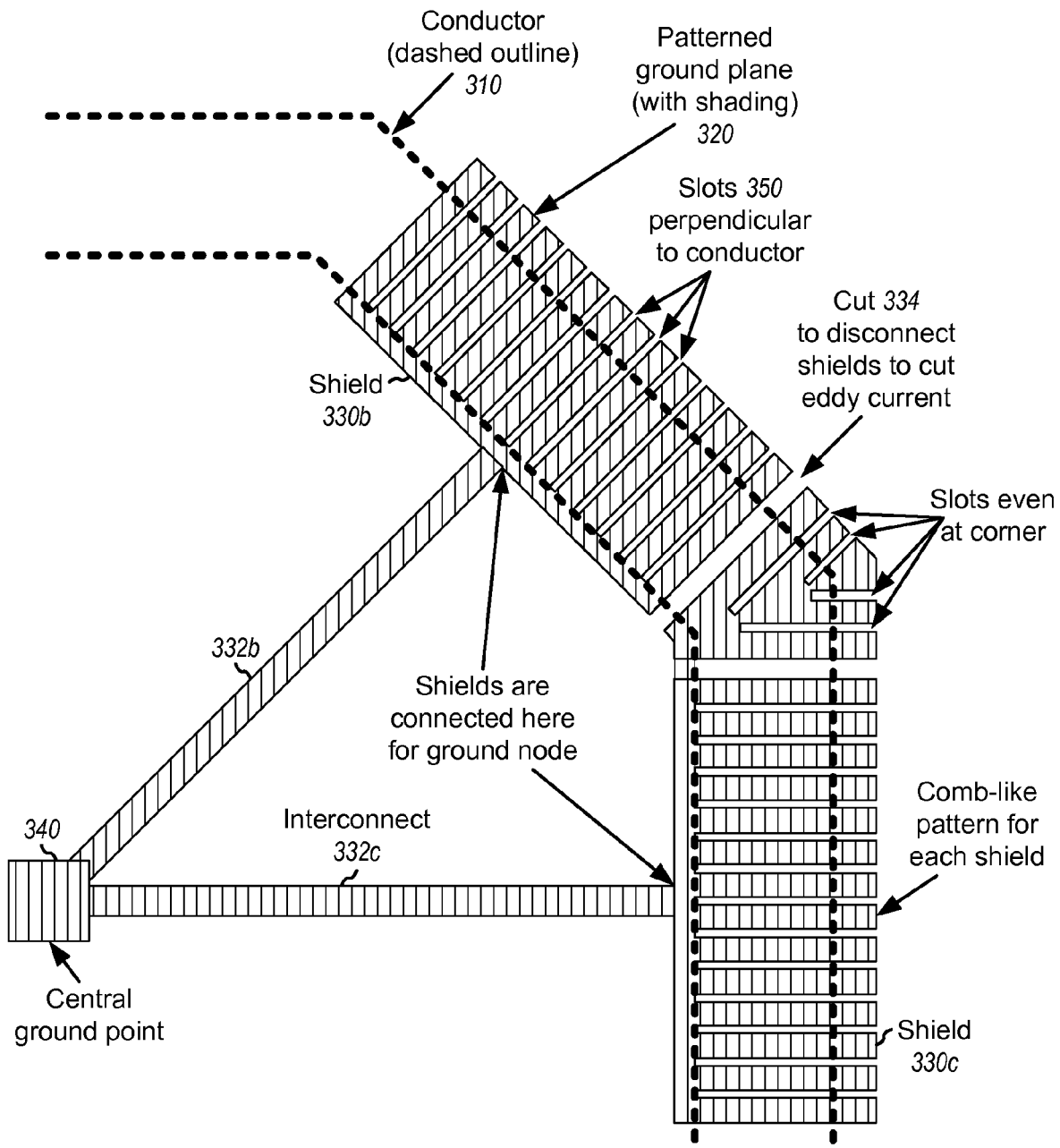
FIG. 4 shows a more detailed top view of a portion of the patterned ground plane.

FIG. 4 shows a top view of a portion of patterned ground plane 320 in greater detail. Shields 330b and 330c of patterned ground plane 320 are electrically isolated by cut 334 to avoid eddy current. Slots 350 are formed on each shield 330 and are perpendicular to conductor 310 above the shield. Slots 350 may be present even at a corner in order to prevent the flow of eddy current. Slots 350 for each shield 330 form a comb-like pattern that has the slot openings on the outside edge and a common connection on the inside edge of the shield. Each shield 330 is coupled to the central ground point via a respective interconnect 332.

Figure 5:
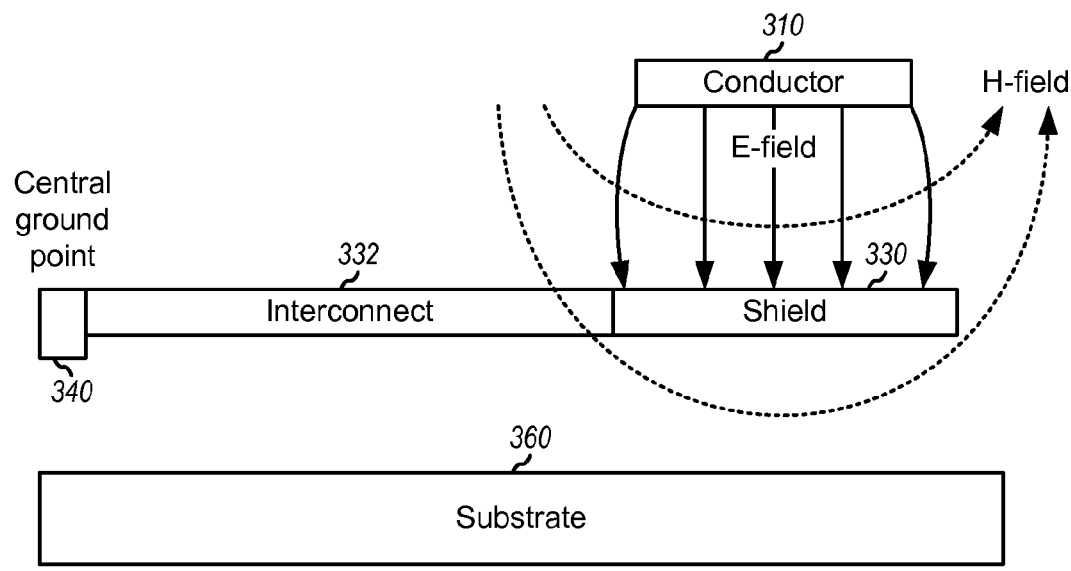
FIG. 5 shows a side view of the inductor with patterned ground plane.

FIG. 5 shows a side view of a portion of inductor 300. Conductor 310 may be formed on one layer of an RFIC. Shield 330 and interconnect 332 for patterned ground plane 320 may be formed on a second layer of the RFIC. The second layer may be any layer of the RFIC above a substrate 360. The electric field (E-field) may run from conductor 310 to shield 330. Most of the electric field may be terminated by shield 330. Shield 330 also provides substate isolation and prevents noise on substrate 360 from coupling to conductor 310. The magnetic field (H-field) may be able to pass freely through the center of patterned ground plane 320 because of the open center area. The magnetic field may also pass through certain parts of shield 330 via slots 350 (not shown in FIG. 5). Slots 350 are perpendicular to conductor 310 and are parallel with the magnetic field.

For clarity, various details of a patterned ground plane have been described above for a 1-turn inductor with an octagonal shape. In general, a conductor for an inductor may have any shape and any number of turns. A patterned ground plane for the conductor may have a shape matching the shape of the conductor. The patterned ground plane may be partitioned into any number of separate shields in order to cut the flow of eddy current through the patterned ground plane. The patterned ground plane may be partitioned such that there is one shield for each side of the conductor, as shown in FIG. 3. The patterned ground plane may also be partitioned into more or fewer number of shields. The shields may be coupled via interconnects to a common ground point, as shown in FIG. 3. Alternatively, the shields may be coupled to circuit ground in other manners, e.g., each shield may be coupled directly to circuit ground. Each shields may have any number of slots, which may have any suitable size and spacing. The slots may be perpendicular to the conductor and may be formed in a comb-like pattern, as shown in FIG. 3, in order to cut the flow of eddy current. The slots may also have other patterns.

The patterned ground plane may be formed with a low-loss metal in order to provide good termination for the electric field and improve substrate isolation. The patterned ground plane may also be formed with a lossy material for other considerations.

Figure 6:
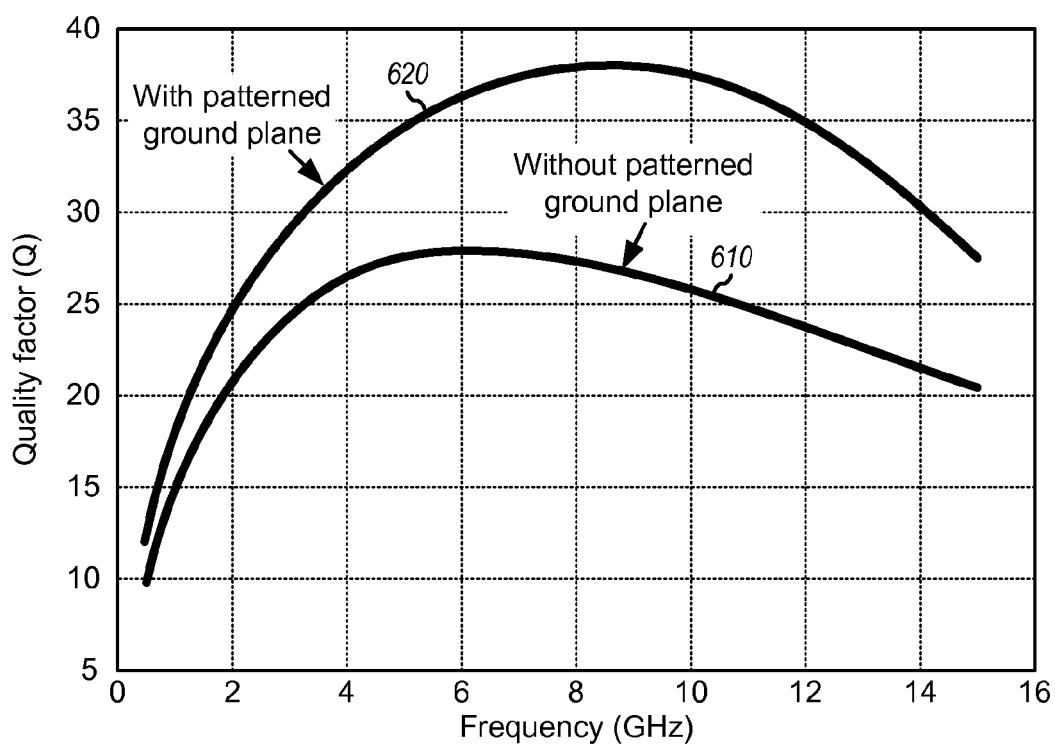
FIG. 6 shows improvement in inductor Q with the patterned ground plane.

FIG. 6 shows improvement in inductor Q achieved with the patterned ground plane described herein. A plot 610 shows the Q of inductor 200 in FIG. 2, which does not have a patterned ground plane. Inductor 200 has a maximum Q of approximately 28 at a frequency of about 6 GHz. A plot 620 shows the Q of inductor 300 in FIG. 3, which has patterned ground plane 320. Inductor 300 has a maximum Q of approximately 38 at a frequency of about 8 GHz. As shown in FIG. 6, the Q of inductor 300 is noticeably better than the Q of inductor 200 over a frequency range from 4 to 12 GHz, which covers the VCO operating frequencies for many communication systems.

An inductor may be fabricated close to a circuit that may generate interference to the inductor. The interference may couple to the inductor via the substrate and/or through other mechanisms. It may be desirable to reduce the amount of interference from the circuit.

Figure 7:
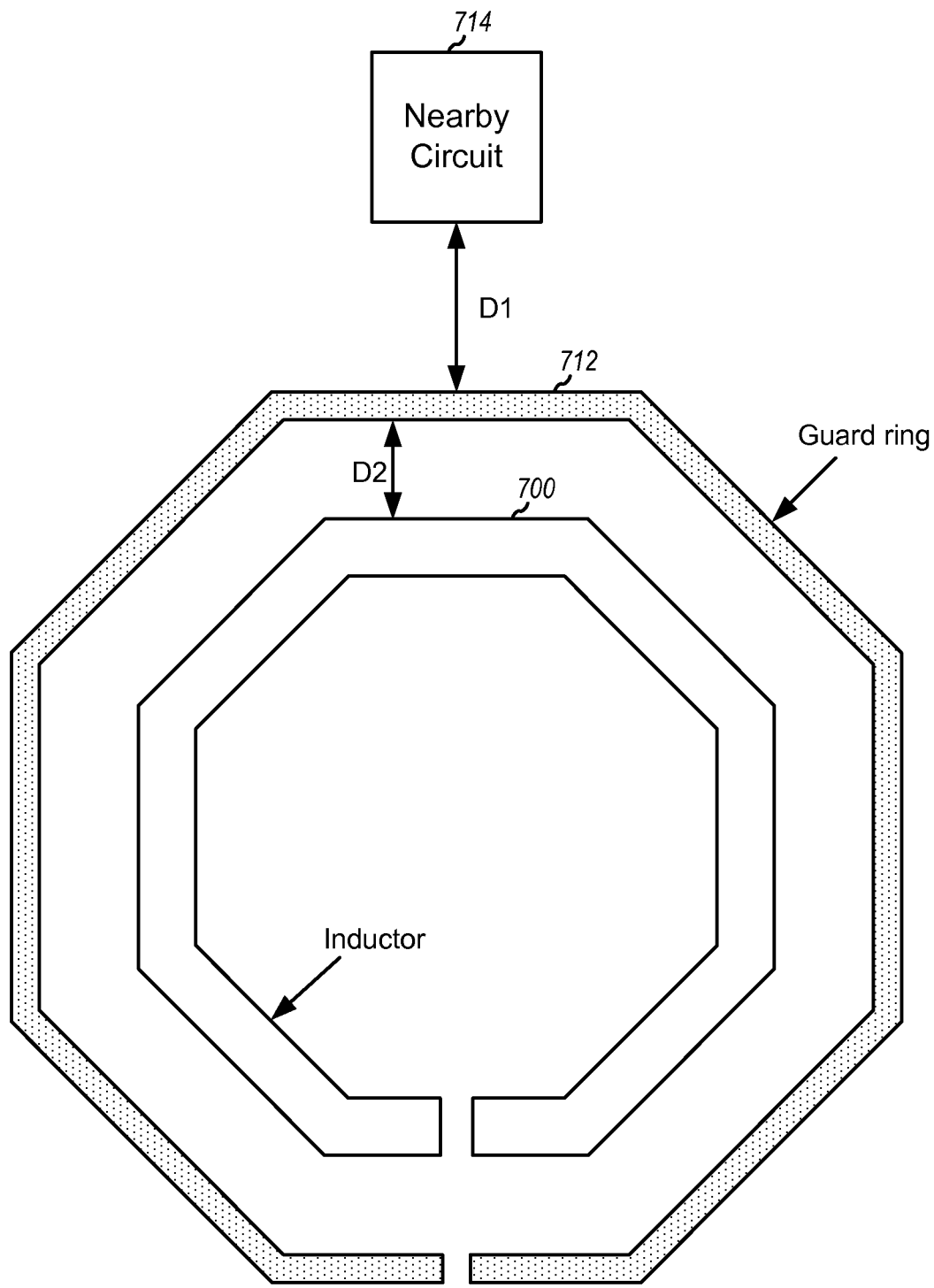
FIG. 7 shows use of a guard ring and a patterned ground plane for isolation.

FIG. 7 shows several mechanisms for achieving isolation of nearby interference. An inductor 700 may be formed near a circuit 714, which may generate interference. Inductor 700 may have a patterned ground plane implemented as described above for FIGS. 3 through 5. The patterned ground plane may provide isolation of interference coupled via the substrate. To further improve isolation, a guard ring 712 may be formed around inductor 700 and may be coupled to circuit ground. Guard ring 712 may provide isolation of interference coupled through the silicon substrate. The distance D2 between guard ring 712 and inductor 700 and the distance D1 between guard ring 712 and circuit 714 may be selected based on the desired amount of isolation.

Figure 8:
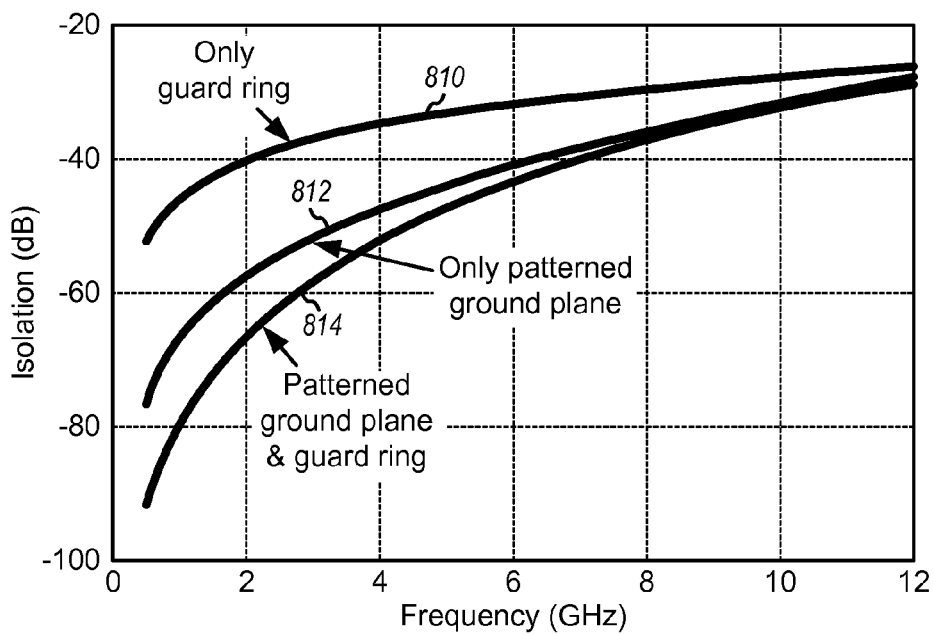
FIG. 8 shows plots of isolation with different isolation mechanisms.

FIG. 8 shows plots of isolation between inductor 700 and circuit 714 in FIG. 7 with different isolation mechanisms. A plot 810 shows isolation between inductor 700 and circuit 714 with only guard ring 712 but no patterned ground plane. A plot 812 shows isolation between inductor 700 and circuit 714 with only a patterned ground plane but no guard ring. Plots 810 and 812 indicate that the patterned ground plane can provide better isolation than the guard ring. This may be due to the fact that the patterned ground plane may be much closer (e.g., few µm) to inductor 700 and may block the way the inductor sees the silicon substrate whereas the guard ring may be much farther away (e.g., tens of µm) from the inductor and can only collect part of the noise that has already coupled onto the substrate.

A plot 814 shows isolation between inductor 700 and circuit 714 with both a patterned ground plane and guard ring 712. Plots 810, 812 and 814 indicate that a combination of the patterned ground plane and guard ring can provide more isolation than either alone. A guard ring may thus be used for an inductor when more isolation is desired, e.g., for a sensitive circuit such as a VCO.

The patterned ground plane described herein may be used for a single-ended inductor, as described above, and also for a differential inductor. The patterned ground plane may also be used for a transformer, a balun used for differential to single-ended conversion, etc. For example, a transformer or a balun may have N turns that may be sequentially numbered from 1 through N. The odd-numbered turns (e.g., turns 1 and 3) may be used for a primary conductor, and the even-numbered turns (e.g., turns 2 and 4) may be used for a secondary conductor.

Figure 9:
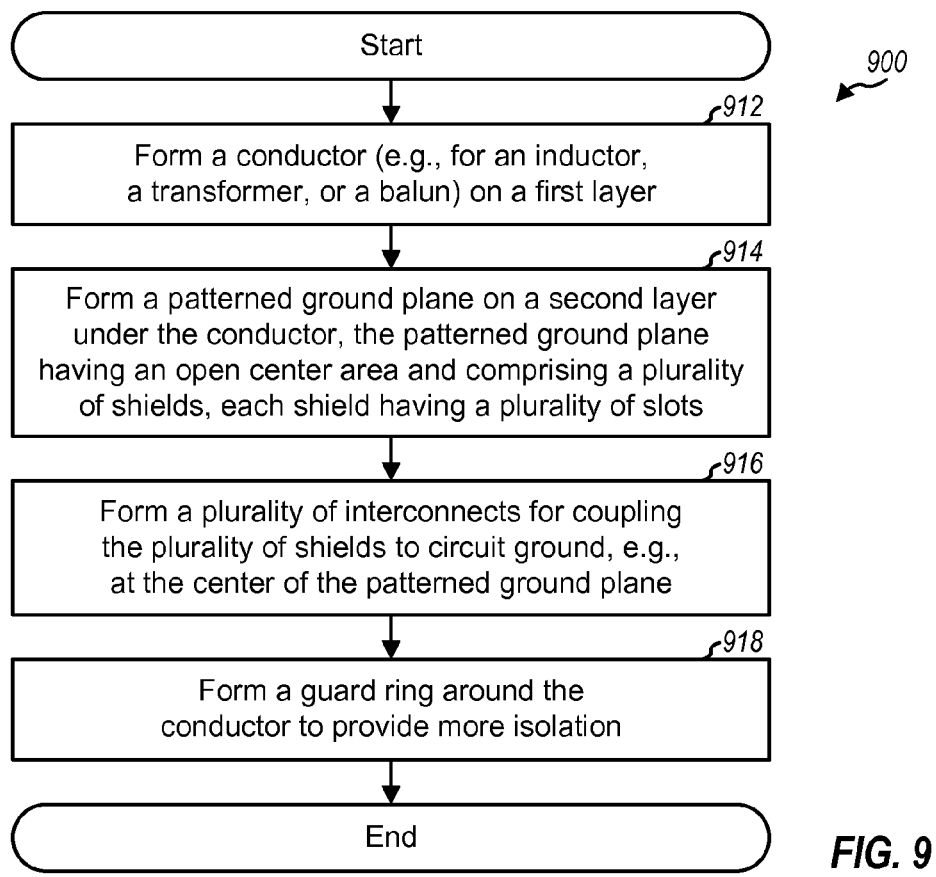
FIG. 9 shows a process for forming the inductor with patterned ground plane.

FIG. 9 shows a design of a process 900 for forming a circuit component with a patterned ground plane. A conductor (e.g., for an inductor, a transformer, or a balun) may be formed on a first layer of an IC or a printed circuit board (block 912). The conductor may have any shape and any number of turns. A patterned ground plane may be formed on a second layer under the conductor, e.g., with a low-loss metal (block 914). The patterned ground plane may have an open center area and a shape matching the shape of the conductor. The patterned ground plane may comprise a plurality of shields. In one design, the conductor has an octagonal shape with eight sides, and the patterned ground plane has eight shields for the eight sides of the conductor. The patterned ground plane may be symmetric with respect to the center of the conductor.

Each shield may have a plurality of slots formed on the shield. The slots may be perpendicular to the conductor and may be formed along the conductor as well as at the corners of the conductor. The slots for each shield may run from an outer edge toward an inner edge of the shield and may stop prior to the inner edge.

A plurality of interconnects may be formed for coupling the plurality of shields to circuit ground, which may be located at the center of the patterned ground plane (block 916). Each interconnect may be coupled between the inner edge of a respective shield and the circuit ground. A guard ring may also be formed around the conductor if more isolation is desired (block 918).

The inductor with patterned ground plane described herein may be used for various systems and applications such as communication, networking, computing, etc. The use of the inductor with patterned ground plane in a wireless communication device is described below.

Figure 10:
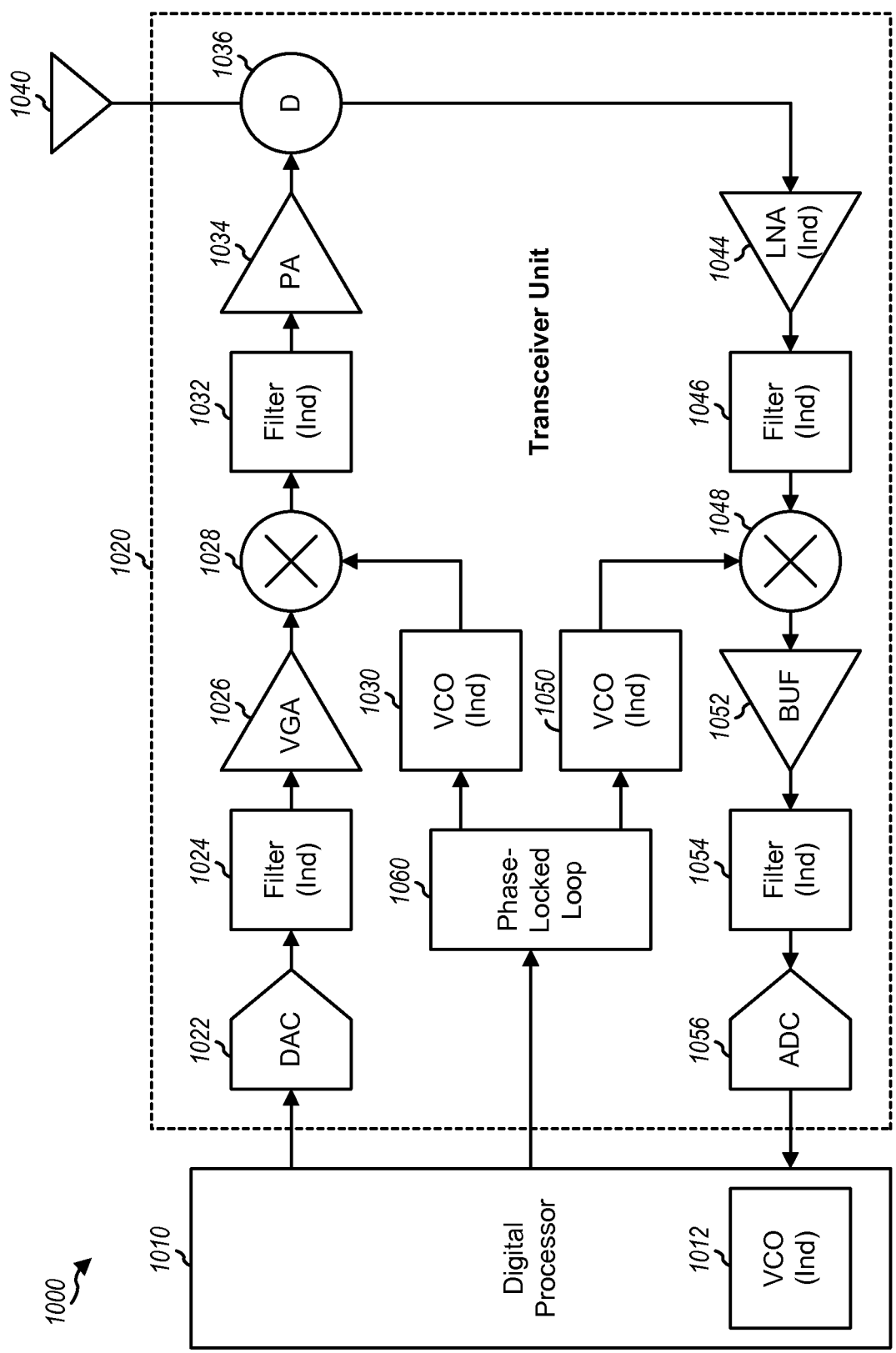
FIG. 10 shows a block diagram of a wireless device.

FIG. 10 shows a block diagram of a wireless device 1000 that may be used for wireless communication. Wireless device 1000 may be a cellular phone, a personal digital assistant (PDA), a terminal, a handset, a wireless modem, a laptop computer, etc. Wireless device 1000 is capable of providing bi-directional communication via a transmit path and a receive path.

On the transmit path, a digital processor 1010 may process data to be transmitted and provide a stream of chips to a transceiver unit 1020. Within transceiver unit 1020, one or more digital-to-analog converters (DACs) 1022 may convert the stream of chips to one or more analog signals. The analog signal(s) may be filtered by a filter 1024, amplified by a variable gain amplifier (VGA) 1026, and frequency upconverted from baseband to RF by a mixer 1028 to generate an upconverted signal. The frequency upconversion may be performed based on a transmit local oscillator (LO) signal from a VCO 1030. The upconverted signal may be filtered by a filter 1032, amplified by a power amplifier (PA) 1034, routed through a duplexer (D) 1036, and transmitted via an antenna 1040.

On the receive path, an RF signal may be received by antenna 1040, routed through duplexer 1036, amplified by an LNA 1044, filtered by a filter 1046, and frequency downconverted from RF to baseband by a mixer 1048 with a receive LO signal from a VCO 1050. The downconverted signal from mixer 1048 may be buffered by a buffer (BUF) 1052, filtered by a filter 1054, and digitized by one or more analog-to-digital converters (ADCs) 1056 to obtain one or more streams of samples. The sample stream(s) may be provided to digital processor 1010 for processing.

FIG. 10 shows a specific transceiver design. In general, the signal conditioning for each path may be performed with one or more stages of amplifier, filter, and mixer. FIG. 10 shows some circuit blocks that may be used for signal conditioning on the transmit and receive paths.

In the design shown in FIG. 10, transceiver unit 1020 includes two VCOs 1030 and 1050 for the transmit and receive paths, respectively. Digital processor 1010 includes a high-speed VCO 1012 that may generate clocks for various units within processor 1010. VCOs 1012, 1030 and 1050 may be implemented with various VCO designs, such as the design shown in FIG. 1. Each VCO may be designed to operate at a specific frequency or a range of frequencies. For example, VCOs 1030 and 1050 may be designed to operate at an integer multiple of (e.g., 1, 2, or 4 times) one or more of the following frequency bands—a Personal Communication System (PCS) band from 1850 to 1990 MHz, a cellular band from 824 to 894 MHz, a Digital Cellular System (DCS) band from 1710 to 1880 MHz, a GSM900 band from 890 to 960 MHz, an International Mobile Telecommunications-2000 (IMT-2000) band from 1920 to 2170 MHz, and a Global Positioning System (GPS) band from 1574.4 to 1576.4 MHz. A phase locked loop (PLL) 1060 may receive control information from digital processor 1010 and provide controls for VCOs 1030 and 1050 to generate the proper transmit and receive LO signals, respectively.

The inductor with patterned ground plane (which is denoted as "Ind" in FIG. 10) may be used for various circuit blocks within wireless device 1000. For example, the inductor with patterned ground plane may be used in a resonator tank circuit for VCO 1012, 1030 and/or 1050. The inductor with patterned ground plane may also be used as a load inductor and/or a degeneration inductor for LNA 1044. The inductor with patterned ground plane may also be used for any of the filters in transceiver unit 1020. The inductor with patterned ground plane may also be used before and/or after mixer 1028 or 1048, after a driver amplifier (not shown in FIG. 10) prior to PA 1034, etc.

The inductor with patterned ground plane described herein may be implemented on an IC, an analog IC, an RFIC, a mixed-signal IC, an application specific integrated circuit (ASIC), a printed circuit board (PCB), an electronics device, etc. The inductor with patterned ground plane may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc.

An apparatus implementing the inductor with patterned ground plane described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
a substrate;
a conductor formed on a first layer;
a patterned ground plane formed on a second layer under the conductor between the conductor and the substrate, the patterned ground plane having an open center area and comprising a plurality of shields, each shield having a plurality of slots, wherein the plurality of slots for each shield form a comb-like pattern that has slot openings on an outside edge and a common connection on an inside edge of a shield, wherein the shields are electrically isolated from each other by cuts located near the eight corners of the patterned ground plane, wherein slots are formed on the plurality of shields along the conductor and also at corners of the conductor, and wherein the patterned ground plane allows a magnetic field to pass through the patterned ground plane to the substrate; and
a plurality of interconnects coupling the plurality of shields to circuit ground located at the center of the patterned ground plane, wherein each interconnect is coupled to an inner edge of a respective shield and the circuit ground.

2. The apparatus of claim 1, wherein the patterned ground plane has a shape matching a shape of the conductor.

3. The apparatus of claim 1, wherein the patterned ground plane is formed with a low-loss metal.

4. The apparatus of claim 1, wherein the patterned ground plane is symmetric with respect to center of the conductor.

5. The apparatus of claim 1, wherein the plurality of slots for each shield are perpendicular to the conductor.

6. The apparatus of claim 1, wherein the plurality of slots for each shield run from an outer edge toward an inner edge of the shield and stop prior to the inner edge.

7. The apparatus of claim 1, wherein the conductor has an octagonal shape with eight sides, and wherein the patterned ground plane comprises eight shields for the eight sides of the conductor.

8. The apparatus of claim 1, wherein the conductor comprises a single turn.

9. The apparatus of claim 1, further comprising:
a guard ring formed around the conductor.

10. The apparatus of claim 1, wherein the conductor and the patterned ground plane are for an inductor.

11. The apparatus of claim 1, wherein the conductor and the patterned ground plane are for a transformer or a balun.

12. The apparatus of claim 1, wherein the slots are even at the corners of the patterned ground plane.

13. An integrated circuit comprising:
a substrate;
a conductor formed on a first layer;
a patterned ground plane formed on a second layer under the conductor between the conductor and the substrate, the patterned ground plane having an open center area and comprising a plurality of shields, each shield having a plurality of slots, wherein the plurality of slots for each shield form a comb-like pattern that has slot openings on an outside edge and a common connection on an inside edge of a shield, wherein the shields are electrically isolated from each other by cuts located near the eight corners of the patterned ground plane, wherein slots are formed on the plurality of shields along the conductor and also at corners of the conductor, and wherein the patterned ground plane allows a magnetic field to pass through the patterned ground plane to the substrate; and a plurality of interconnects coupling the plurality of shields to circuit ground located at the center of the patterned ground plane, wherein each interconnect is coupled to an inner edge of a respective shield and the circuit ground.

14. The integrated circuit of claim 13, wherein the patterned ground plane has a shape matching a shape of the conductor.

15. The integrated circuit of claim 13, wherein the plurality of slots for each shield are perpendicular to the conductor.

16. A method comprising:

forming a conductor on a first layer; and forming a patterned ground plane on a second layer under the conductor between the conductor and a substrate, the patterned ground plane having an open center area and comprising a plurality of shields, each shield having a plurality of slots, wherein the plurality of slots for each shield form a comb-like pattern that has slot openings on an outside edge and a common connection on an inside edge of a shield, wherein the shields are electrically isolated from each other by cuts located near the eight corners of the patterned ground plane, wherein slots are formed on the plurality of shields along the conductor and also at corners of the conductor, wherein the patterned ground plane allows a magnetic field to pass through the patterned ground plane to the substrate, wherein a plurality of interconnects couple the plurality of shields to circuit ground located at the center of the patterned ground plane, and wherein each interconnect is coupled to an inner edge of a respective shield and the circuit ground.

17. The method of claim 16, wherein the forming the patterned ground plane comprises forming the patterned ground plane with a shape matching a shape of the conductor.

18. The method of claim 16, further comprising:

forming the plurality of slots for each shield perpendicular to the conductor.

19. An apparatus comprising:

means for forming a conductor on a first layer; and means for forming a patterned ground plane on a second layer under the conductor between the conductor and a substrate, the patterned ground plane having an open center area and comprising a plurality of shields, each shield having a plurality of slots, wherein the plurality of slots for each shield form a comb-like pattern that has slot openings on an outside edge and a common connection on an inside edge of a shield, wherein the shields are electrically isolated from each other by cuts located near the eight corners of the patterned ground plane, wherein slots are formed on the plurality of shields along the conductor and also at corners of the conductor, wherein the patterned ground plane allows a magnetic field to pass through the patterned ground plane to the substrate, wherein a plurality of interconnects couple the plurality of shields to circuit ground located at the center of the patterned ground plane, and wherein each interconnect is coupled to an inner edge of a respective shield and the circuit ground.

20. The apparatus of claim 19, wherein the means for forming the patterned ground plane comprises means for forming the patterned ground plane with a shape matching a shape of the conductor.

21. The apparatus of claim 19, further comprising:

means for forming the plurality of slots for each shield perpendicular to the conductor.

22. An apparatus comprising:

an inductor comprising a conductor formed on a first layer and a patterned ground plane formed on a second layer under the conductor between the conductor and a substrate, the patterned ground plane having an open center area and comprising a plurality of shields, each shield having a plurality of slots, wherein the plurality of slots for each shield form a comb-like pattern that has slot openings on an outside edge and a common connection on an inside edge of a shield, wherein the shields are electrically isolated from each other by cuts located near the eight corners of the patterned ground plane, wherein slots are formed on the plurality of shields along the conductor and also at corners of the conductor, wherein the patterned ground plane allows a magnetic field to pass through the patterned ground plane to the substrate, wherein a plurality of interconnects couple the plurality of shields to circuit ground located at the center of the patterned ground plane, and wherein each interconnect is coupled to an inner edge of a respective shield and the circuit ground; and an amplifier coupled to the inductor.

23. The apparatus of claim 22, wherein the inductor and the amplifier form an oscillator, and wherein the inductor is part of a resonant tank circuit for the oscillator.

24. The apparatus of claim 22, wherein the inductor and the amplifier form a low noise amplifier (LNA), and wherein the inductor is a degeneration inductor or a load inductor for the LNA.

* * * * *